United States Patent
Lan

(10) Patent No.: US 10,104,807 B2
(45) Date of Patent: Oct. 16, 2018

(54) THERMAL MODULE

(71) Applicant: ASIA VITAL COMPONENTS CO., LTD., New Taipei (TW)

(72) Inventor: Wen-Ji Lan, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 0 days.

(21) Appl. No.: 15/436,870

(22) Filed: Feb. 20, 2017

(65) Prior Publication Data

US 2018/0242475 A1   Aug. 23, 2018

(51) Int. Cl.
*H05K 7/20* (2006.01)
*F28F 1/30* (2006.01)
*F28F 1/26* (2006.01)
*H01L 23/367* (2006.01)

(52) U.S. Cl.
CPC .......... *H05K 7/20409* (2013.01); *F28F 1/30* (2013.01); *F28F 1/26* (2013.01); *H01L 23/3672* (2013.01); *H05K 7/20418* (2013.01)

(58) Field of Classification Search
CPC ... H05K 7/20409; H05K 7/20418; F28F 1/26; H01L 23/3672
USPC ............................................ 165/80.3, 104.33
See application file for complete search history.

(56) References Cited

U.S. PATENT DOCUMENTS

| | | | | |
|---|---|---|---|---|
| 7,377,306 | B2 * | 5/2008 | Hashimoto | G06F 1/20 165/104.33 |
| 8,230,908 | B2 * | 7/2012 | Foster, Sr. | F28D 15/0233 165/104.33 |
| 2009/0139692 | A1 * | 6/2009 | Lin | H01L 23/3672 165/80.3 |

* cited by examiner

*Primary Examiner* — Orlando E Aviles Bosques
*Assistant Examiner* — Joel Attey
(74) *Attorney, Agent, or Firm* — Jackson IPG PLLC; Demian K. Jackson

(57) ABSTRACT

A thermal module includes a heat dissipation unit having a receiving space, a first radiating fin assembly and a second radiating fin assembly. The first and second radiating fin assembles are disposed in the receiving space. At least one first protrusion section protrudes from the first radiating fin assembly. A top end of the first protrusion section is formed with a first apex. Two sides of the first apex are formed with a first slope and a second slope. At least one second protrusion section protrudes from the second radiating fin assembly corresponding to the first protrusion section. A top end of the second protrusion section is formed with a second apex. Two sides of the second apex are formed with a third slope and a fourth slope. The second apex abuts against the first apex to define an open space between the first and second radiating fin assemblies.

13 Claims, 16 Drawing Sheets

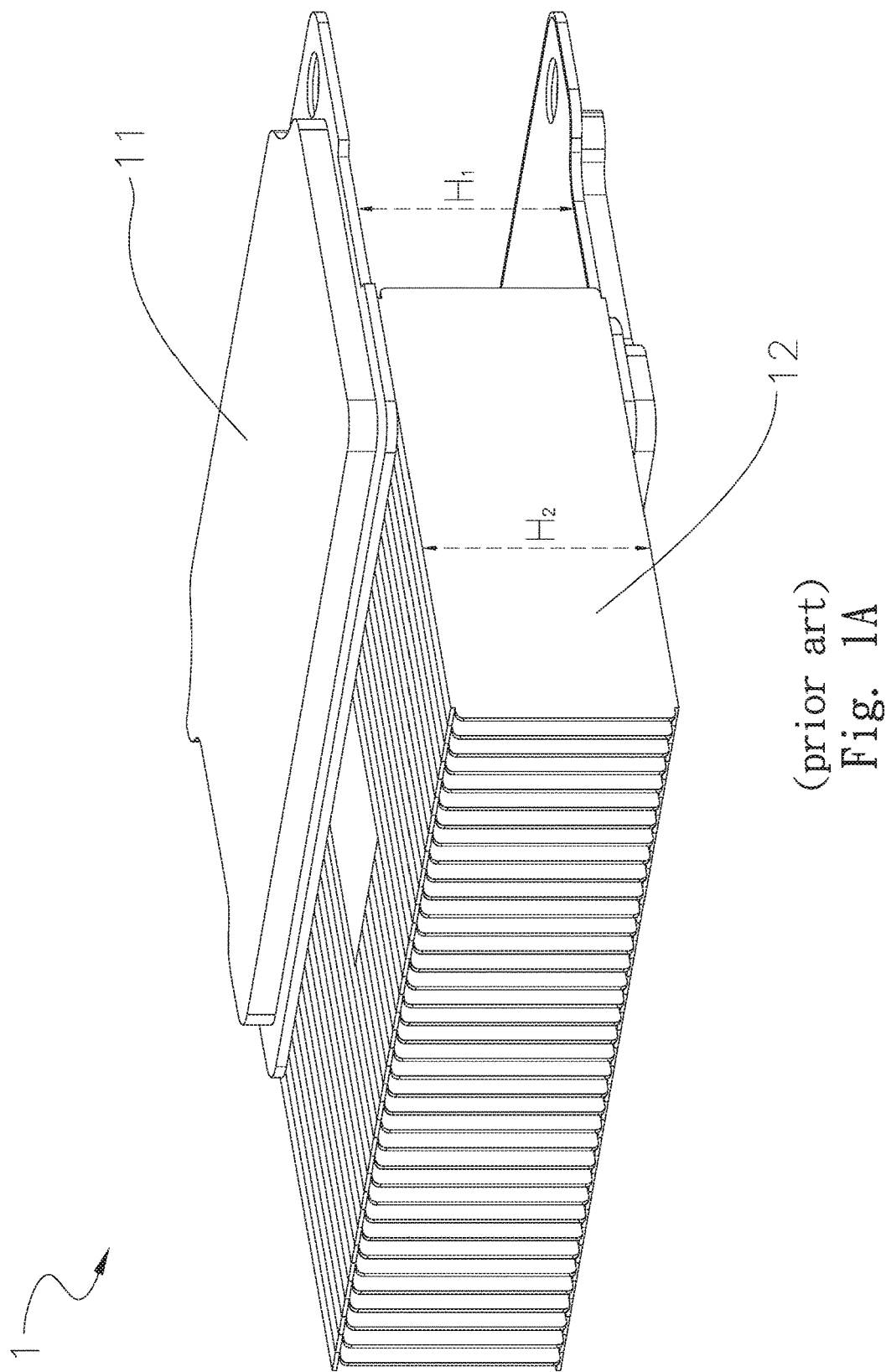

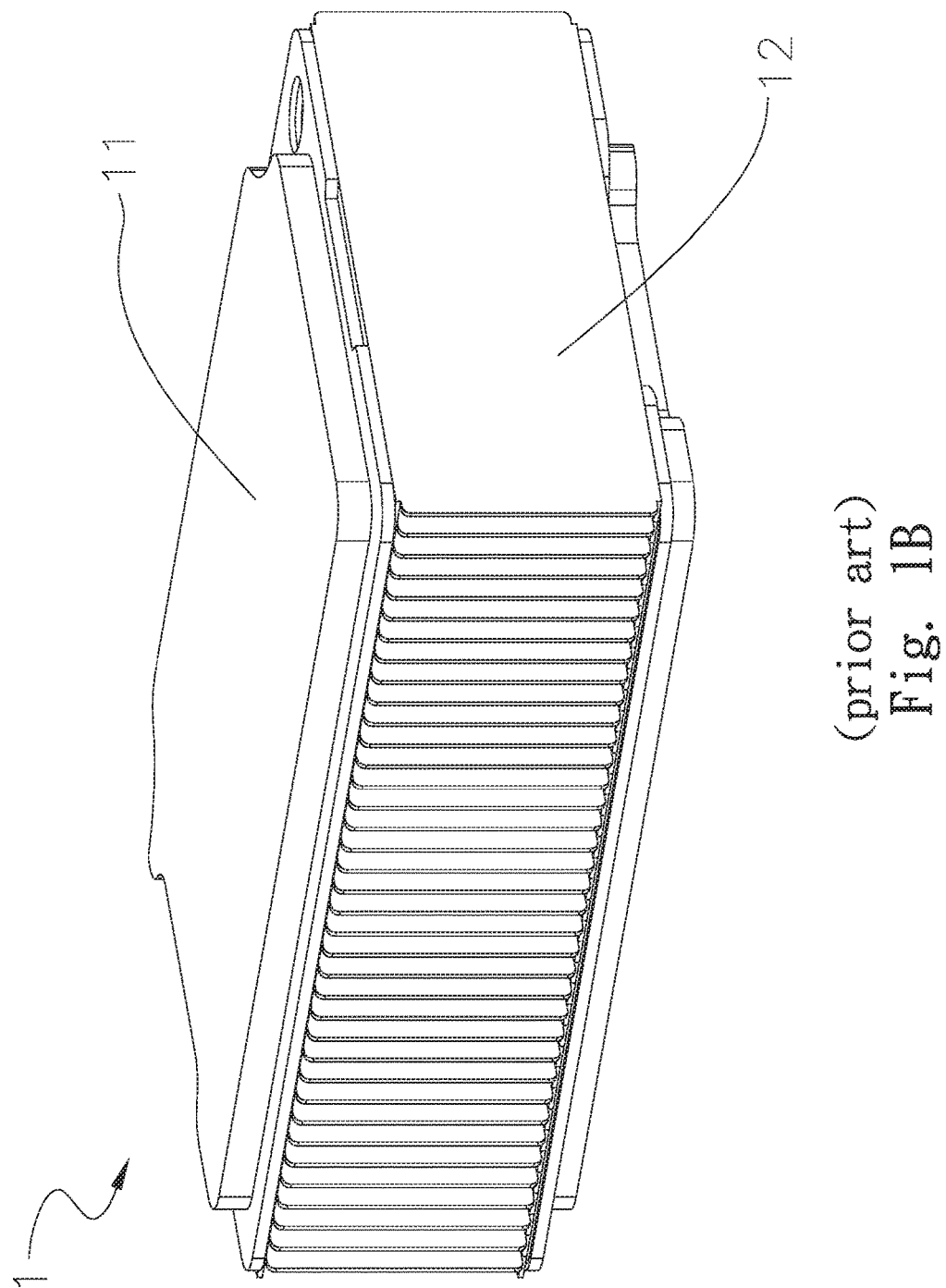

THERMAL MODULE

BACKGROUND OF THE INVENTION

1. Field of the Invention

The present invention relates generally to a thermal module, and more particularly to a thermal module, which can improve the problem of the conventional thermal module that when the radiating fin assembly is assembled with the heat dissipation unit, the solder paste is apt to be scraped off.

2. Description of the Related Art

Along with the advance of semiconductor technique, the volume of integrated circuit has become smaller and smaller. In order to process more data, the current integrated circuit with the same volume has contained numerous calculation components several times more than the components contained in the conventional integrated circuit. There are more and more calculation components contained in the integrated circuit. Therefore, the execution efficiency of the integrated circuit is higher and higher. As a result, in working, the heat generated by the calculation components is also higher and higher. With a common central processing unit taken as an example, in a full-load working state, the heat generated by the central processing unit is high enough to burn down the entire central processing unit. Therefore, the heat dissipation problem of the integrated circuit has become a very important issue.

The central processing unit and the chips or other electronic components in the electronic apparatus are all heat sources. When the electronic apparatus operates, these heat sources will generate heat. Currently, heat conduction components with good heat dissipation and conduction performance, such as heat pipes, vapor chambers and flat-plate heat pipes are often used to conduct or spread the heat. In these heat dissipation components, the heat pipe serves to conduct heat to a remote end. One end of the heat pipe absorbs the heat to evaporate and convert the internal liquid working fluid into vapor working fluid. The vapor working fluid transfers the heat to the other end of the heat pipe to achieve the heat conduction effect. With respect to a part with larger heat transfer area, a vapor chamber is selected as the heat dissipation component. One plane face of the vapor chamber is in contact with the heat source to absorb the heat. The heat is then transferred to the other face and dissipated to condense the vapor working fluid.

FIGS. 1A and 1B show a conventional thermal module including a heat dissipation component 1. The heat dissipation component 1 includes two vapor chambers 11 and a column body connected between the two vapor chambers 11. (The column body is enclosed by a radiating fin assembly 12 and thus is not shown.) The radiating fin assembly 12 is positioned in the heat dissipation component 1. In use, the radiating fin assembly 12 is directly placed between the two vapor chambers 11 and assembled therewith. Solder paste is first painted on the upper and lower sides of the radiating fin assembly 12 (or painted on the vapor chambers 11). Then, the radiating fin assembly 12 with the solder paste is placed between the two vapor chambers 11. The height (distance) $H_1$ between the two vapor chambers 11 is just equal to the height $H_2$ of the radiating fin assembly 12. This is for tightly and securely connecting the radiating fin assembly 12 with the two vapor chambers 11. Therefore, when the radiating fin assembly 12 is placed between the two vapor chambers 11, the radiating fin assembly 12 will contact and attach to at least one of the two vapor chambers 12 and then slid into the heat dissipation component 1. Under such circumstance, in the assembling and mounting process, the solder paste painted on upper and lower sides of the radiating fin assembly 12 will be partially scraped off by the vapor chambers 12 to cause a loss. As a result, when soldered, the radiating fin assembly 12 cannot be truly fully connected with the heat dissipation component 1 due to the loss of the solder paste. This will deteriorate the rigidity of the thermal module and cause thermal resistance.

SUMMARY OF THE INVENTION

It is therefore a primary object of the present invention to provide a thermal module, which can greatly improve the problem of the conventional thermal module that when the radiating fin assembly is assembled with the heat dissipation unit, the solder paste is apt to be scraped off.

It is a further object of the present invention to provide the above thermal module, which is more securely assembled.

To achieve the above and other objects, the thermal module of the present invention includes a heat dissipation unit, a first radiating fin assembly and a second radiating fin assembly. The heat dissipation unit has a first main body and a second main body. The first main body has a first surface and a second surface. The second main body has a third surface and a fourth surface. Two ends of a tubular body are respectively connected with the first and third surfaces. The first and second main bodies and the tubular body together define a receiving space. The first and second radiating fin assembles are disposed in the receiving space. The first radiating fin assembly has a first side and a second side. At least one first protrusion section protrudes from the second side. A top end of the first protrusion section is formed with a first apex. Two sides of the first apex are formed with a first slope and a second slope. The second radiating fin assembly has a third side and a fourth side. The third side is correspondingly assembled with the second side. At least one second protrusion section protrudes from the third side corresponding to the first protrusion section. A top end of the second protrusion section is formed with a second apex. Two sides of the second apex are formed with a third slope and a fourth slope.

In the above thermal module, the first radiating fin assembly further has a first end and a second end and the second radiating fin assembly further has a third end and a fourth end. In practice, solder paste is first painted on the first and fourth sides. Then, the first and second radiating fin assemblies are overlapped with each other. Then, the first and second radiating fin assemblies are together placed into the receiving space of the heat dissipation unit. The first and second protrusion sections are misaligned from each other so that the first end and the third end are not flush with each other. Also, the second end and the fourth end are not flush with each other. Then, the first radiating fin assembly is slid and pushed in a direction from the first end to the second end. At this time, the second slope contacts the third slope and slides upward, whereby the second apex correspondingly abuts against the first apex to form an open space between the first and second radiating fin assemblies. Accordingly, the first and fourth sides of the first and second radiating fin assemblies respectively tightly attach to the first and third surfaces of the heat dissipation unit, whereby the first and second radiating fin assemblies can be more securely connected with the heat dissipation unit to improve the problem of the conventional thermal module that when the radiating fin assembly is assembled with the heat dissipation unit, the solder paste is apt to be scraped off.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein:

FIG. 1A is a perspective exploded view of a conventional thermal module;

FIG. 1B is a perspective assembled view of the conventional thermal module;

DETAILED DESCRIPTION OF THE PREFERRED EMBODIMENTS

Figure 2:
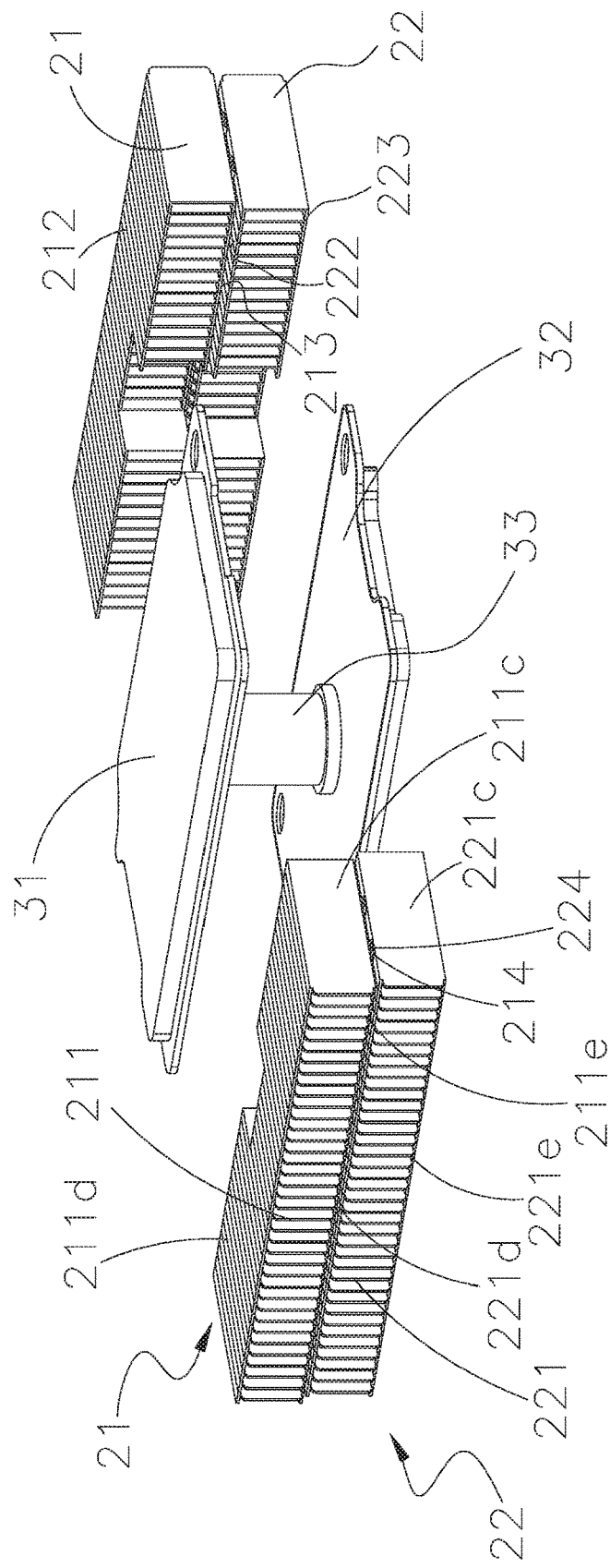
FIG. 2 is a perspective exploded view of a first embodiment of the thermal module of the present invention.
Figure 3:
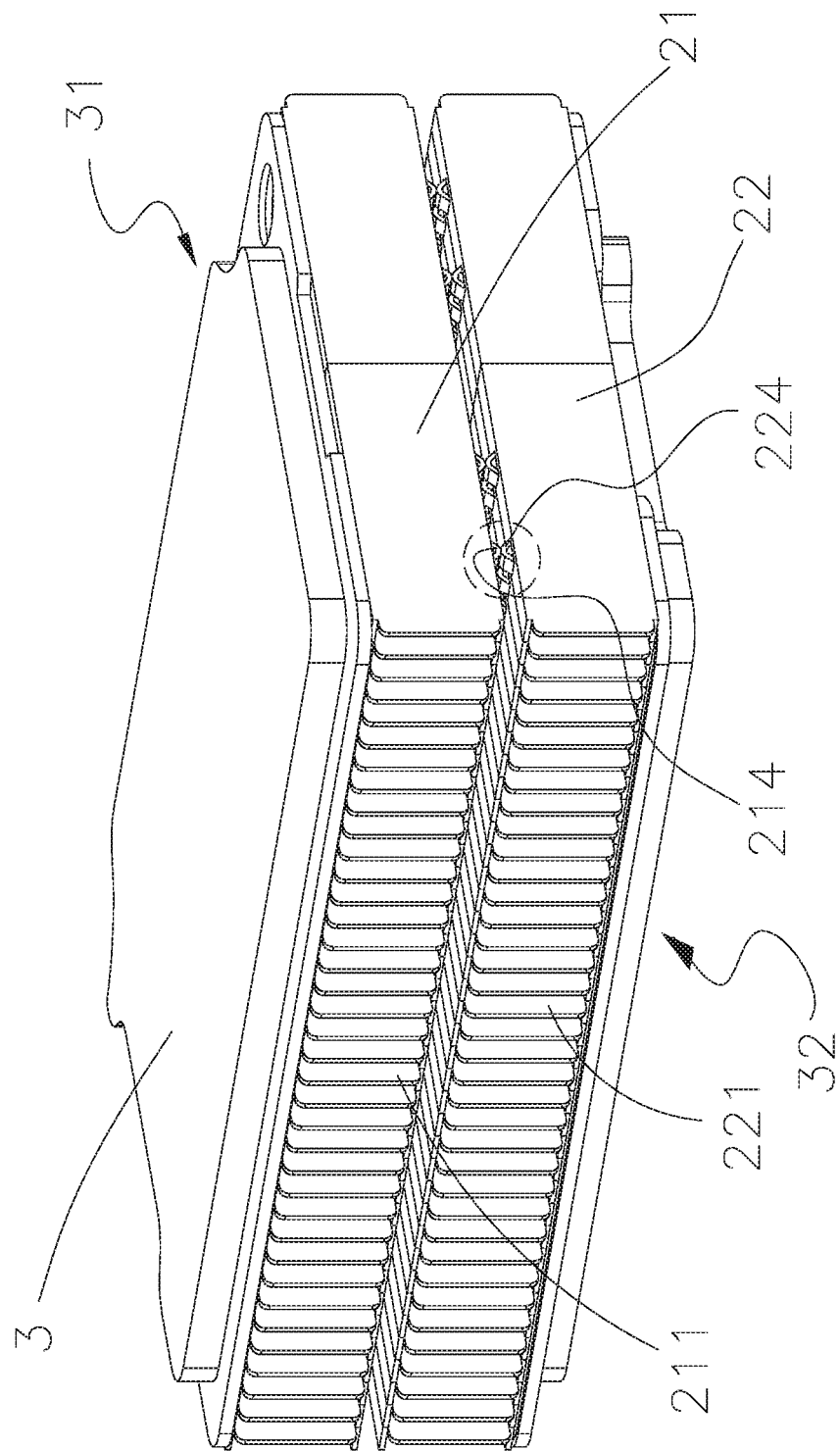
FIG. 3 is a perspective assembled view of the first embodiment of the thermal module of the present invention.
Figure 4:
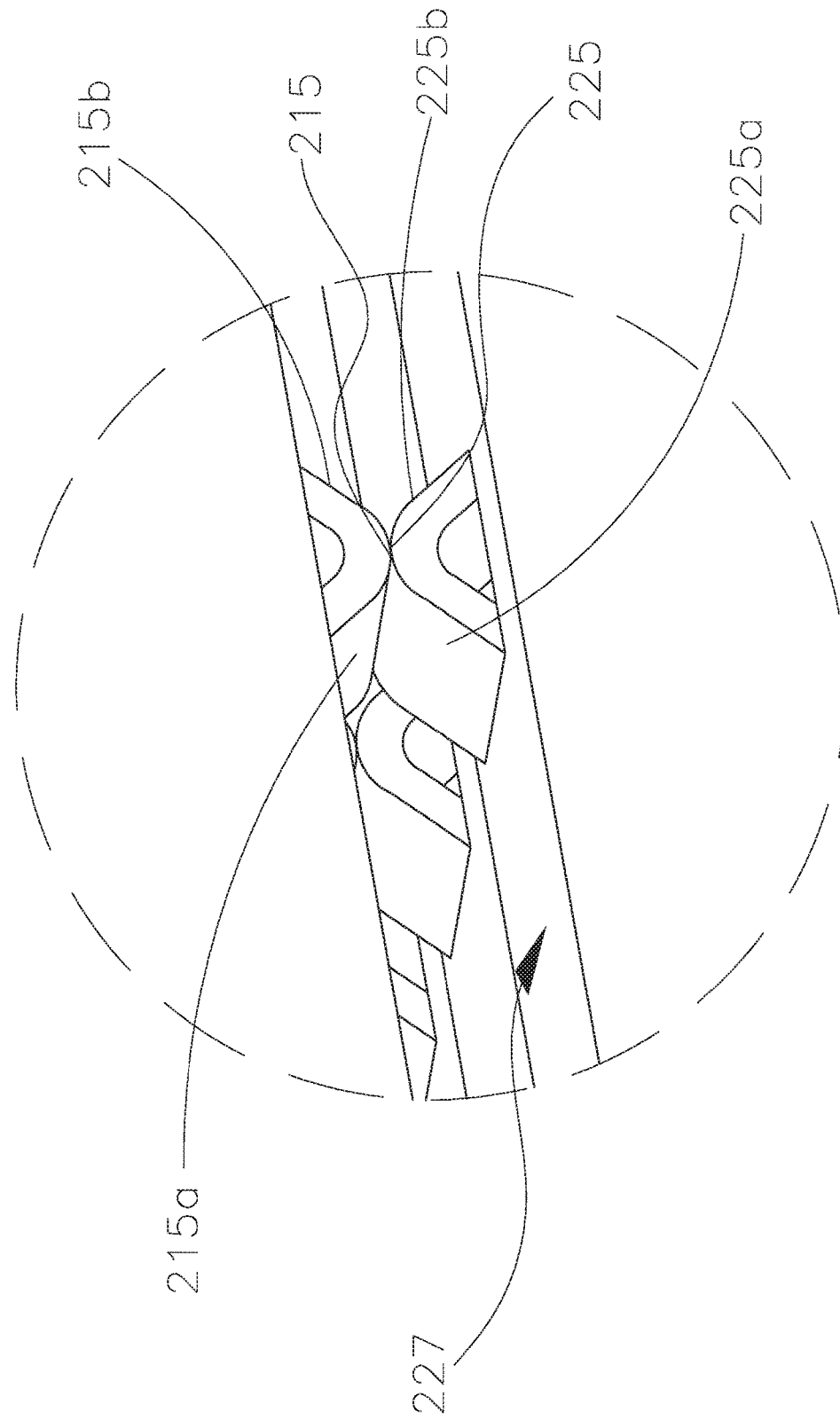
FIG. 4 is an enlarged view of the circled area of FIG. 3.

Please refer to FIGS. 2, 3 and 4. FIG. 2 is a perspective exploded view of a first embodiment of the thermal module of the present invention. FIG. 3 is a perspective assembled view of the first embodiment of the thermal module of the present invention. FIG. 4 is an enlarged view of the circled area of FIG. 3. According to the first embodiment, the thermal module of the present invention includes a heat dissipation unit 3, a first radiating fin assembly 21 and a second radiating fin assembly 22. The first radiating fin assembly 21 is composed of multiple first radiating fins 211. The first radiating fin assembly 21 has a first side 212 and a second side 213. Each first radiating fin 211 has a first plane face 211c. Two sides of the first plane face 211c are bent to form a first bent face 211d and a second bent face 211e. At least one first protrusion section 214 protrudes from the second bent face 211e. The top end of the first protrusion section 214 is formed with a first apex 215. Two sides of the first apex 215 are formed with a first slope 215a and a second slope 215b. The second radiating fin assembly 22 is composed of multiple second radiating fins 221. The second radiating fin assembly 22 has a third side 222 and a fourth side 223. The third side 222 is correspondingly assembled with the second side 213. Each second radiating fin 221 has a second plane face 221c. Two sides of the second plane face 221c are bent to form a third bent face 221d and a fourth bent face 221e. At least one second protrusion section 224 protrudes from the third bent face 221d corresponding to the first protrusion section 214. The top end of the second protrusion section 224 is formed with a second apex 225. Two sides of the second apex 225 are formed with a third slope 225a and a fourth slope 225b. The first and second slopes 215a, 215b have, but not limited to, equal lengths. The third and fourth slopes 225a, 225b have, but not limited to, equal lengths. In practice, the length of the first slope 215a can be larger than the length of the second slope 215b and the length of the third slope 225a can be smaller than the length of the fourth slope 215b. Accordingly, the slopes of the second and third slopes 215b, 225a are larger than the slopes of the first and fourth slopes 215a, 225b.

Figure 5:
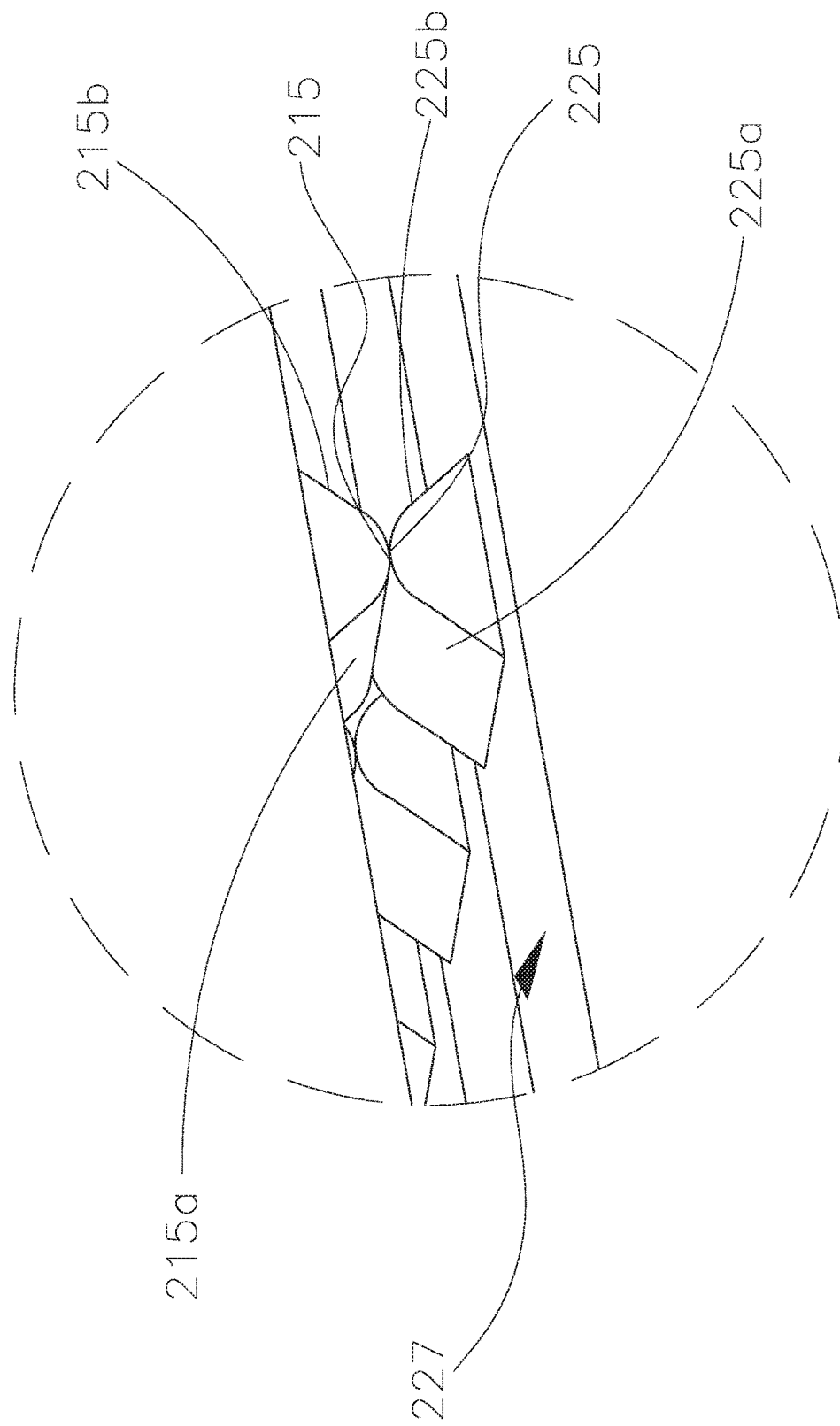
FIG. 5 is another enlarged view of the circled area of FIG. 3.

In this embodiment, the first and second protrusion sections 214, 224 are, but not limited to, respectively arranged on the second and third sides 213, 222 at equal intervals. In practice, as required, the first and second protrusion sections 214, 224 can be respectively arranged on the second and third sides 213, 222 at unequal intervals. In addition, the first and second protrusion sections 214, 224 can be formed by means of pressing processing such as slitting (as shown in FIG. 4) or punching (as shown in FIG. 5).

Figure 6:
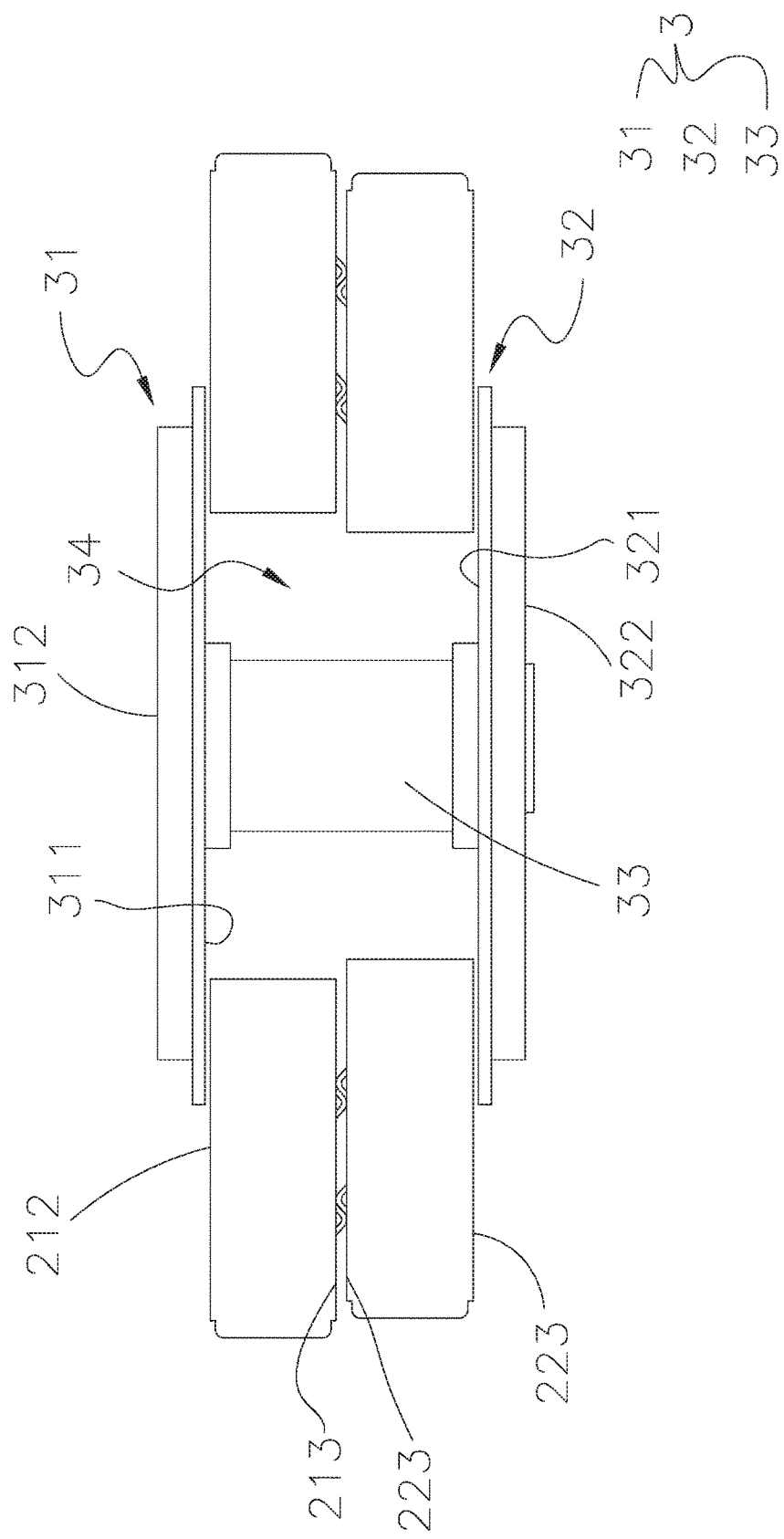
FIG. 6 is a side view of the first embodiment of the thermal module of the present invention.
Figure 7:
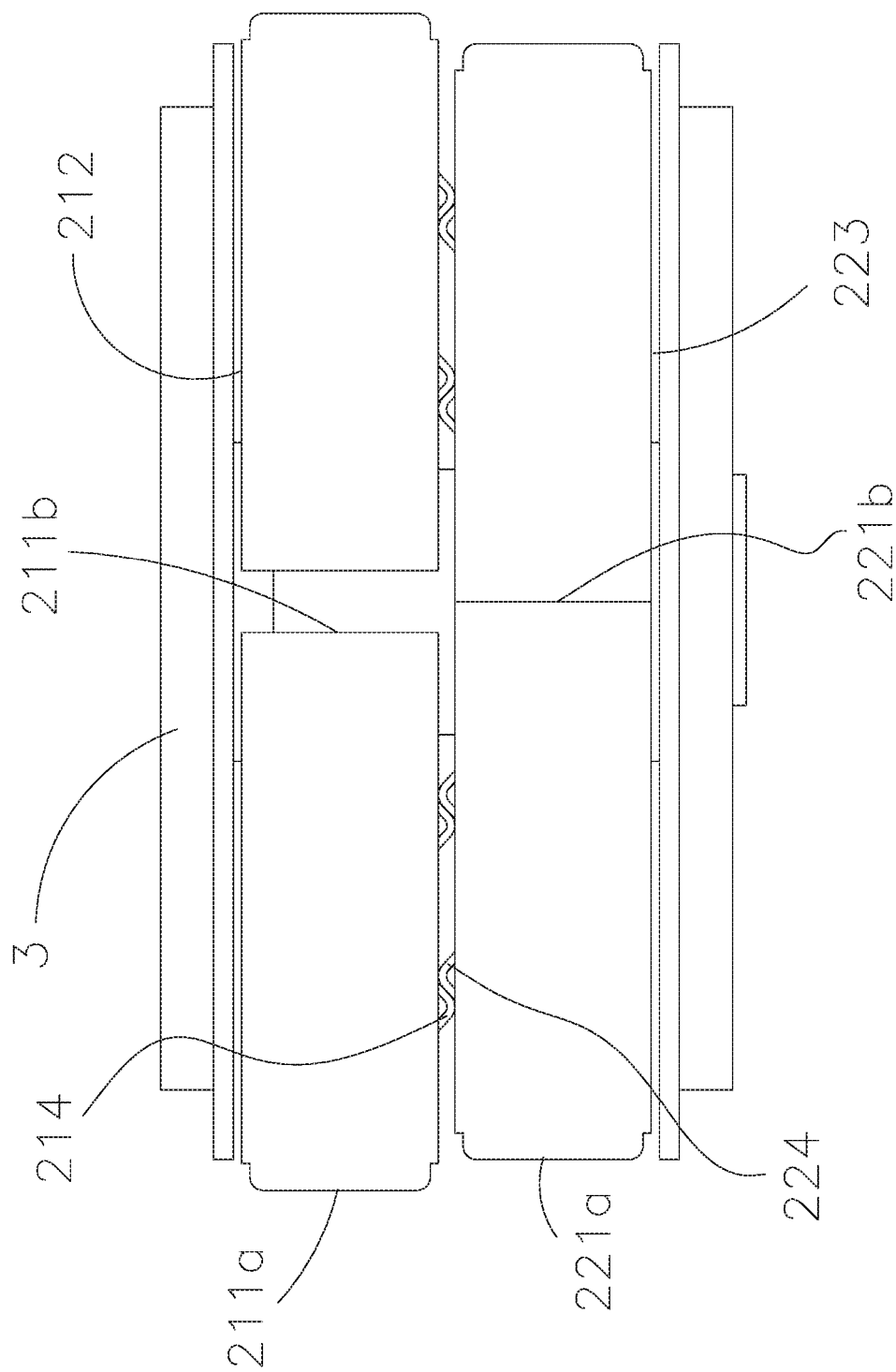
FIG. 7 is another side view of the first embodiment of the thermal module of the present invention.
Figure 8:
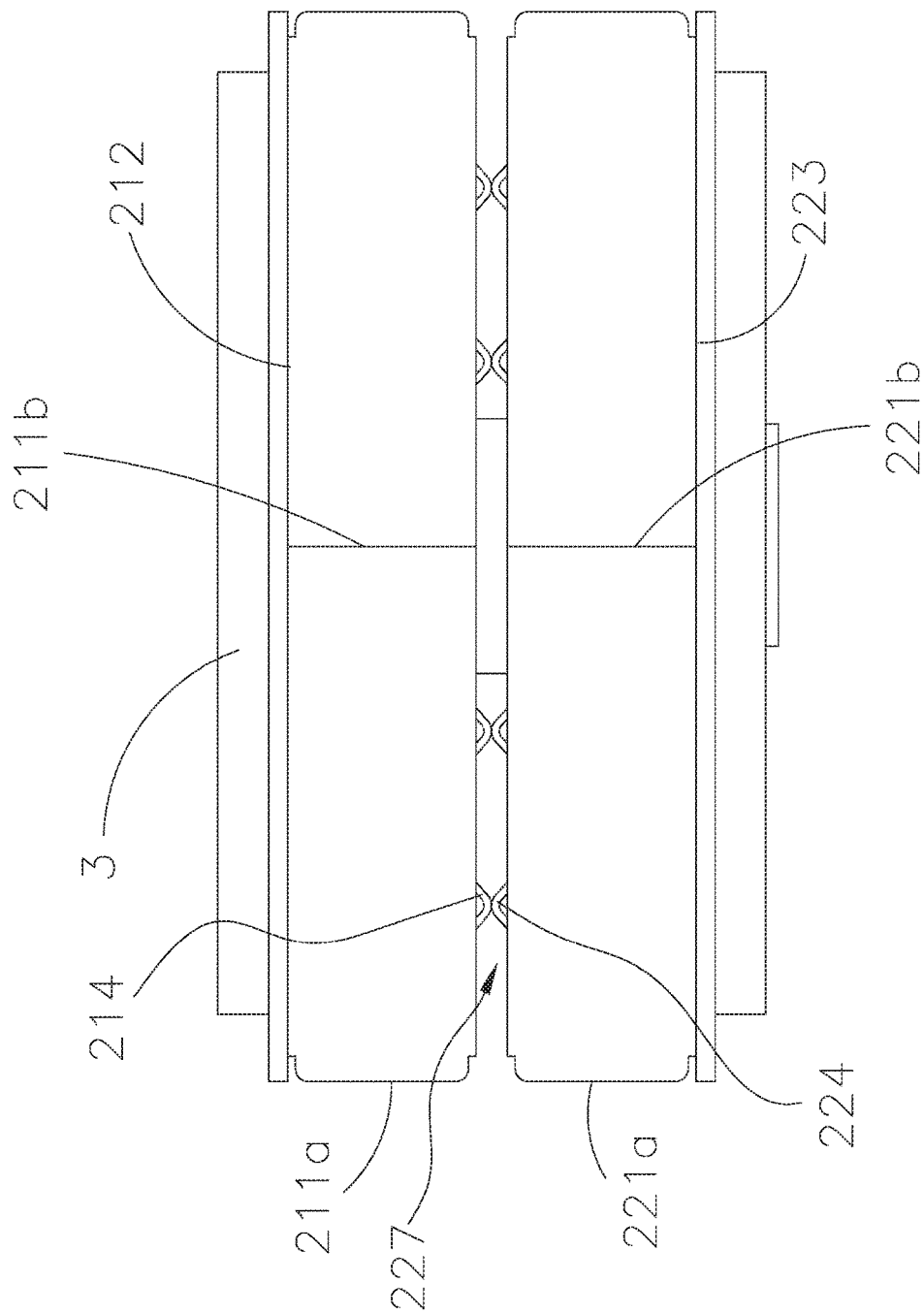
FIG. 8 is still another side view of the first embodiment of the thermal module of the present invention.

Please now refer to FIGS. 6, 7 and 8. FIG. 6 is a side view of the first embodiment of the thermal module of the present invention. FIG. 7 is another side view of the first embodiment of the thermal module of the present invention. FIG. 8 is still another side view of the first embodiment of the thermal module of the present invention. The first radiating fin assembly 21 further has a first end 211a and a second end 211b. The second radiating fin assembly 22 further has a third end 221a and a fourth end 221b.

As shown in the drawings, in this embodiment, there are two sets of first and second radiating fin assembles 21, 22, which are identical to each other in both practical operation and assembling manner. One set of first and second radiating fin assemblies 21, 22 is taken as an example for illustration purposes.

In practice, the first and second radiating fin assembles 21, 22 are assembled with the heat dissipation unit 3. The heat dissipation unit 3 has a first main body 31 and a second main body 32. The first main body 31 has a first surface 311 and a second surface 312. The second main body 32 has a third surface 321 and a fourth surface 322. Two ends of a tubular body 32 are respectively connected with the first and third surfaces 311, 322. The first and second main bodies 31, 32 and the tubular body 33 together define a receiving space 34.

First, solder paste is painted on the first side 212 of the first radiating fin assembly 21 and the fourth side 223 of the second radiating fin assembly 22. Then, the first and second radiating fin assemblies 21, 22 are overlapped with each other. Then, the first and second radiating fin assemblies 21, 22 are together placed into the receiving space 34 of the heat dissipation unit 3. The first and second protrusion sections 214, 224 are positioned on the second and third sides 213, 222 in a misaligned state. The first and second protrusion sections 214, 224 are misaligned from each other so that the first end 211a of the first radiating fin assembly 21 and the third end 221a of the second radiating fin assembly 22 are not flush with each other. Also, the second end 211b of the first radiating fin assembly 21 and the fourth end 221b of the second radiating fin assembly 22 are not flush with each other. Then, the first radiating fin assembly 21 is slid and pushed in a direction from the first end 211a to the second end 211b to make the first and third ends 211a, 221a become flush with each other and the second and fourth ends 211b, 221b become flush with each other. At this time, the second slope 215b contacts the third slope 225a and slides upward, whereby the second apex 225 correspondingly abuts against the first apex 215 to form an open space 227 between the first and second radiating fin assemblies 21, 22. Under such circumstance, the first and fourth sides 212, 223 of the first and second radiating fin assemblies 21, 22 respectively tightly attach to the first and third surfaces 311, 321 of the heat dissipation unit 3. Accordingly, the first and second radiating fin assemblies 21, 22 can be more securely connected with the heat dissipation unit 3 to improve the problem of the conventional thermal module that when the radiating fin assembly is assembled with the heat dissipation unit, the solder paste is apt to be scraped off.

Figure 9:
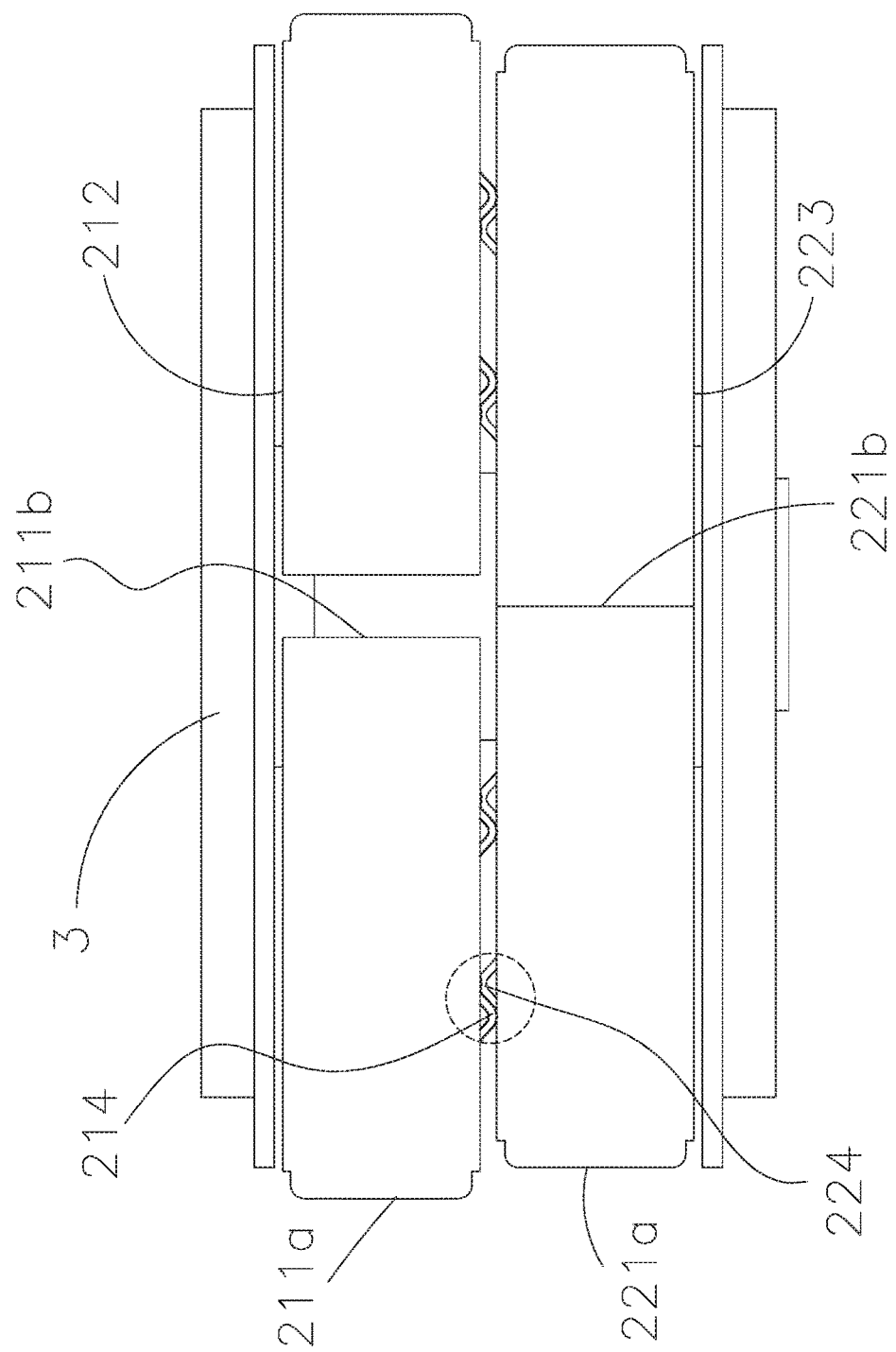
FIG. 9 is a side view of a second embodiment of the thermal module of the present invention.
Figure 10:
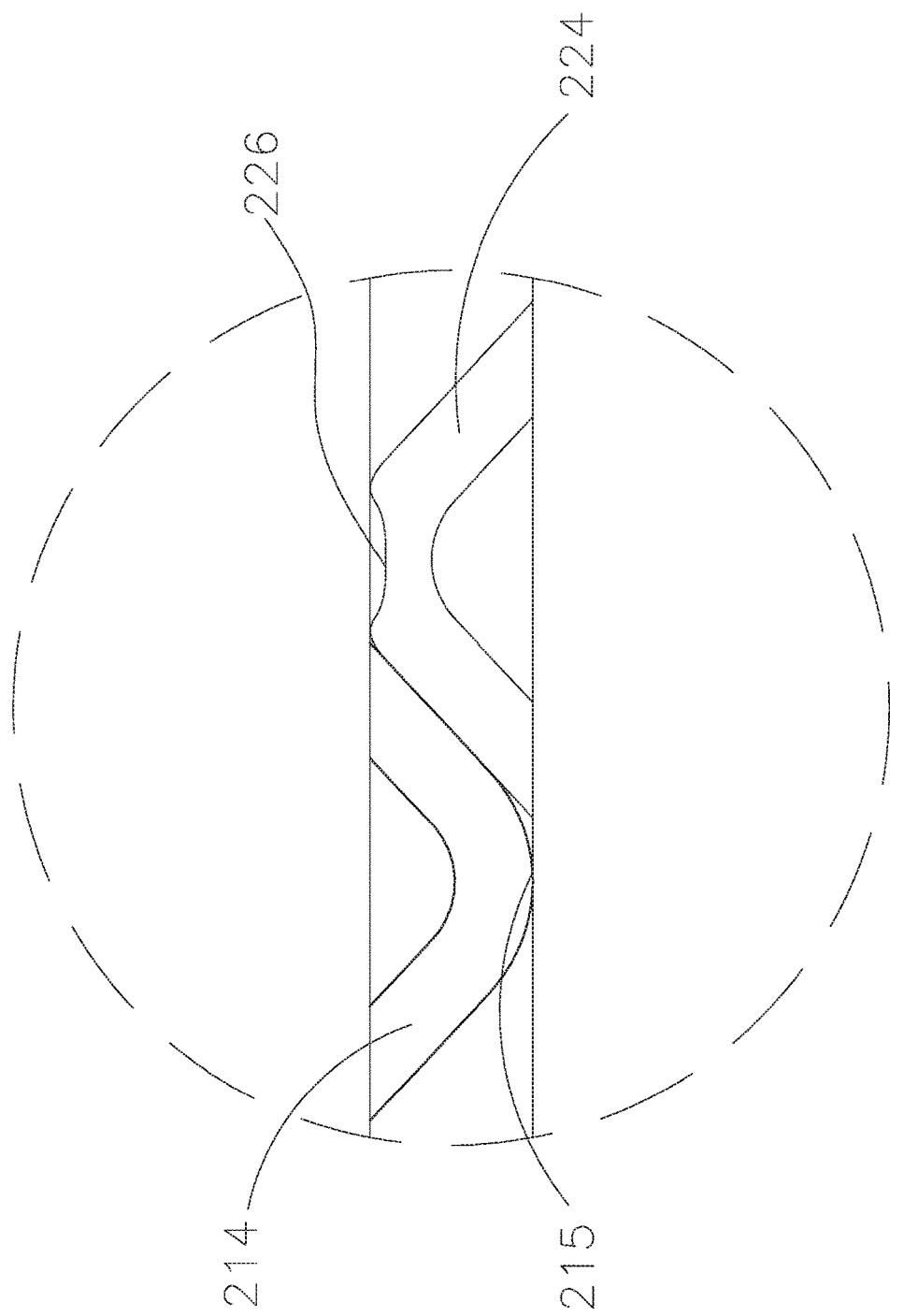
FIG. 10 is an enlarged sectional view of the circled area of FIG. 9.
Figure 11:
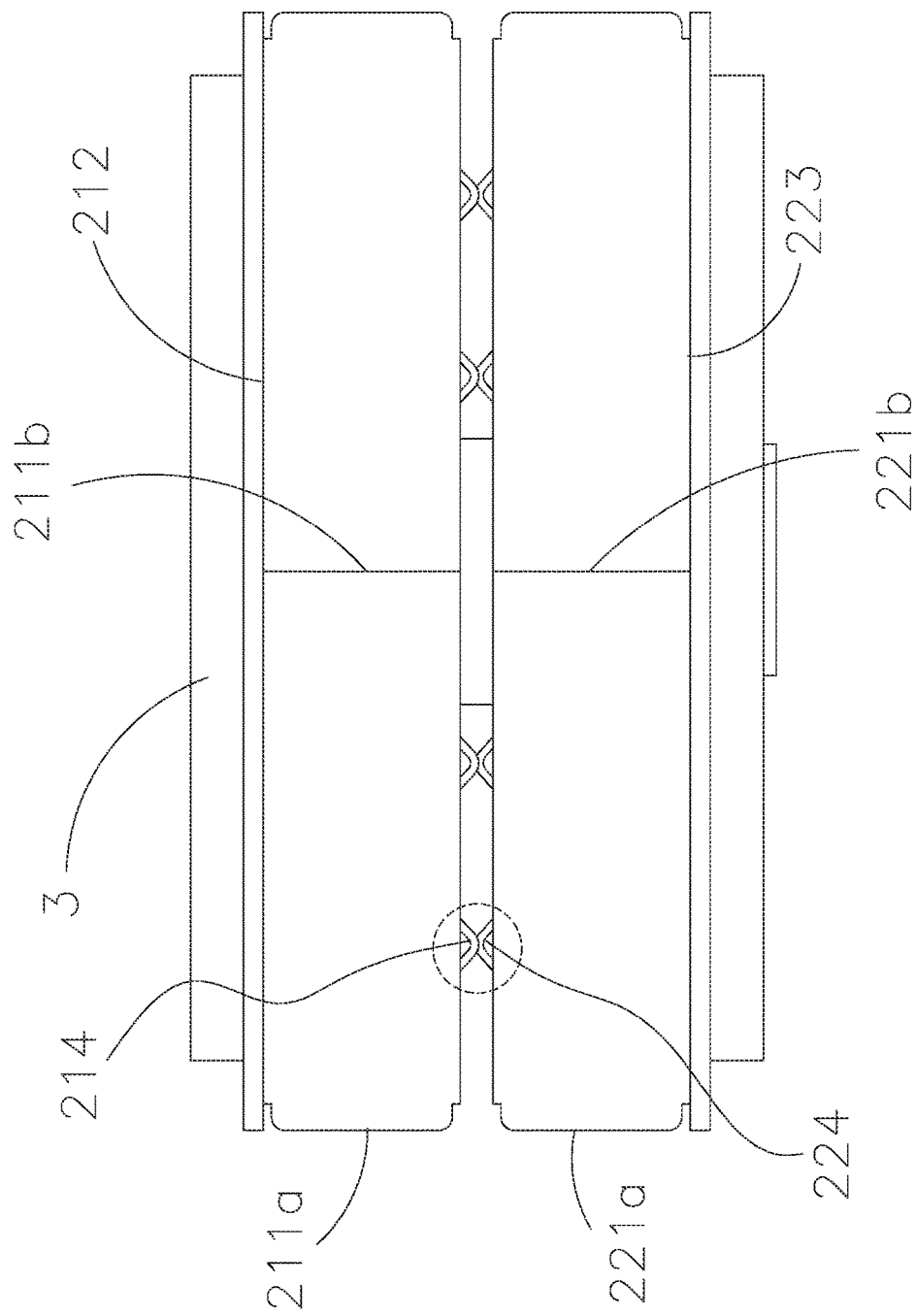
FIG. 11 is a side view of the second embodiment of the thermal module of the present invention.
Figure 12:
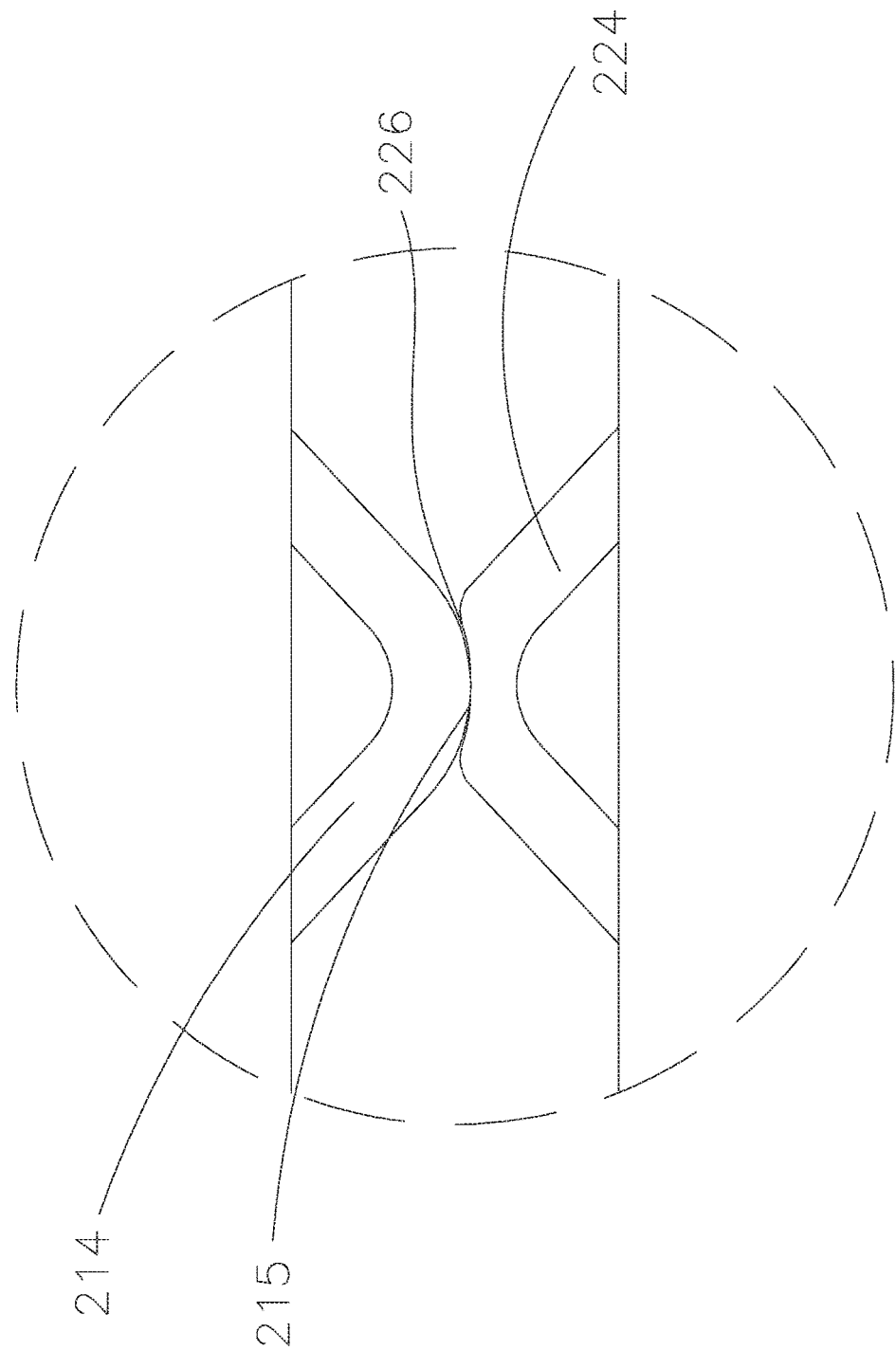
FIG. 12 is an enlarged sectional view of the circled area of FIG. 11.

Please now refer to FIGS. 9, 10, 11 and 12 as well as FIGS. 3 and 4. FIG. 9 is a side view of a second embodiment of the thermal module of the present invention. FIG. 10 is an enlarged sectional view of the circled area of FIG. 9. FIG. 11 is a side view of the second embodiment of the thermal module of the present invention. FIG. 12 is an enlarged sectional view of the circled area of FIG. 11. The second embodiment is partially identical to the first embodiment in component and relationship between the components and thus will not be repeatedly described hereinafter. The second embodiment is mainly different from the first embodiment in that a depression 226 is further formed on the second apex 225 and the first apex 215 correspondingly abuts against the depression 226. The structure of the depression 226 makes the first apex 215 contact the second apex 225 by larger area. This not only can achieve the same effect as the first embodiment, but also makes the first radiating fin assembly 21 more securely correspondingly assembled with the second radiating fin assembly 22.

Figure 13:
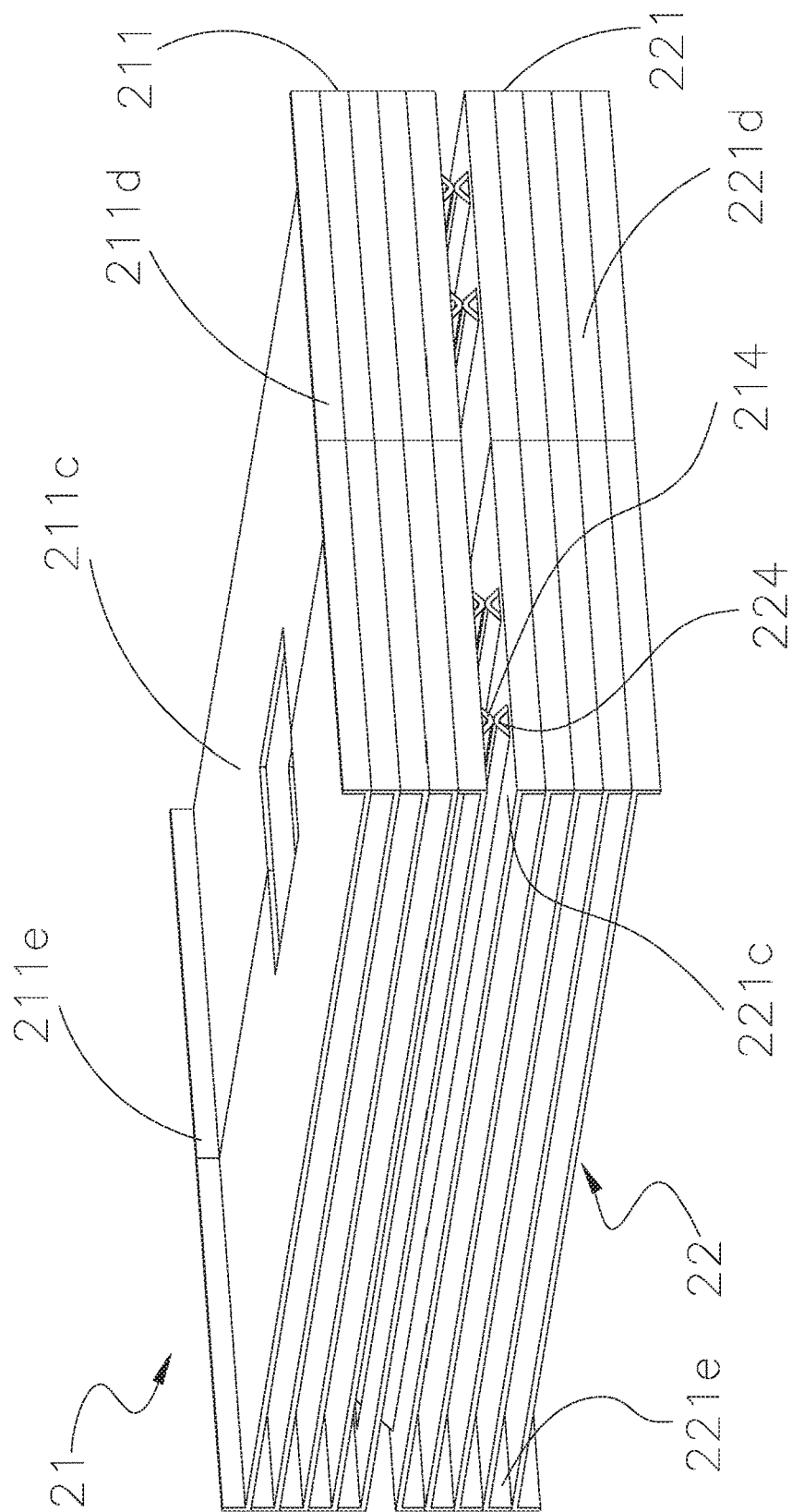
FIG. 13 is a perspective view of a third embodiment of the thermal module of the present invention.
Figure 14:
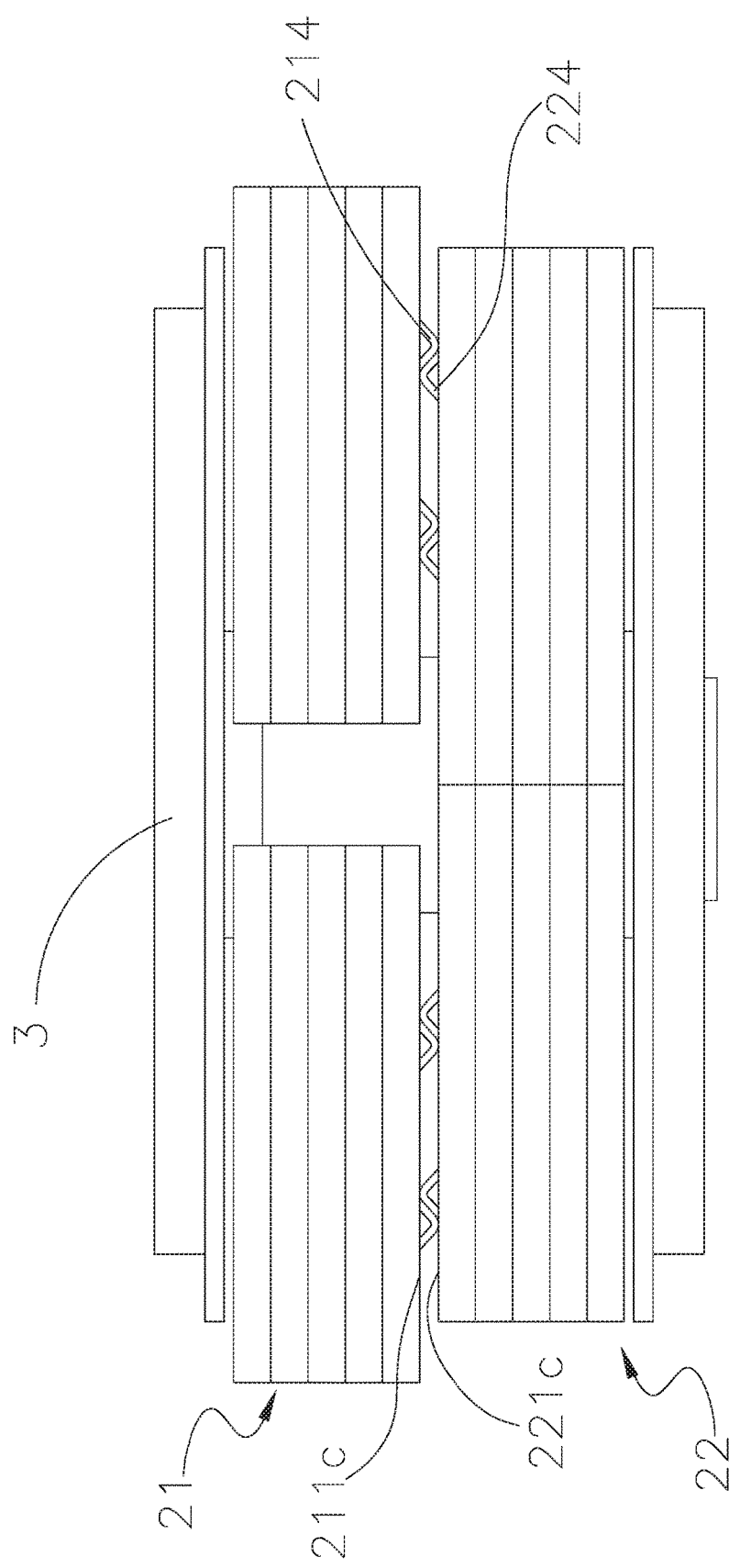
FIG. 14 is a side view of the third embodiment of the thermal module of the present invention.
Figure 15:
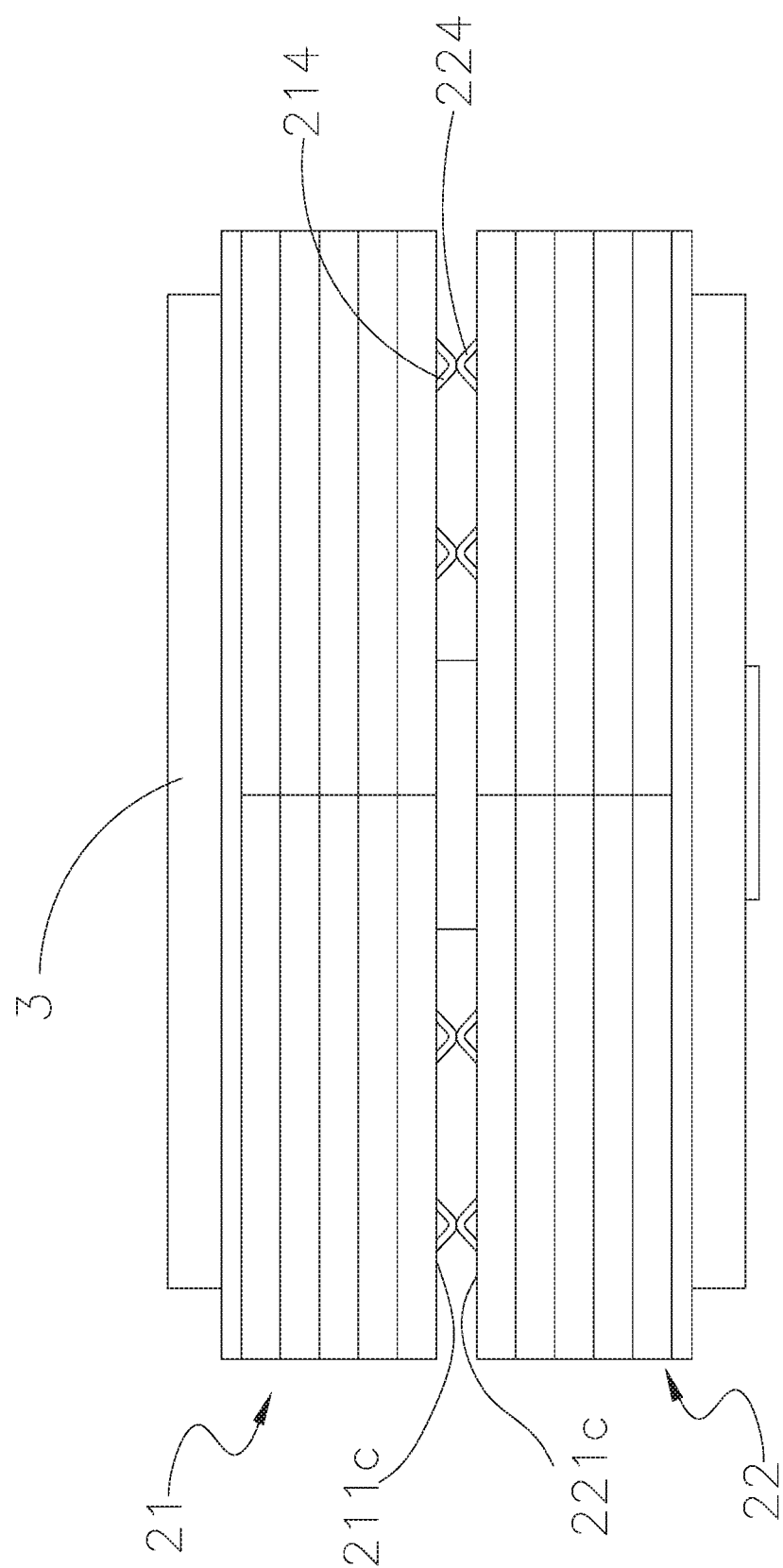
FIG. 15 is another side view of the third embodiment of the thermal module of the present invention.

Please now refer to FIGS. 13, 14 and 15. FIG. 13 is a perspective view of a third embodiment of the thermal module of the present invention. FIG. 14 is a side view of the third embodiment of the thermal module of the present invention. FIG. 15 is another side view of the third embodiment of the thermal module of the present invention. The third embodiment is partially identical to the first embodiment in component and relationship between the components and thus will not be repeatedly described hereinafter. The third embodiment is mainly different from the first embodiment in that the first protrusion section 214 is disposed on the first plane face 211c of the first radiating fin 211 and the second protrusion section 224 is disposed on the second plane face 221c of the second radiating fin 221. The first and second protrusion sections 214, 224 are arranged in a misaligned state. Moreover, the first and second protrusion sections 214, 224 are longitudinally or transversely disposed on the first and second plane faces 211c, 221c. In use, the first radiating fin assembly is slid and pushed to make the first protrusion section 214 correspondingly abut against the second protrusion section 224. This can achieve the same effect as the first embodiment.

In conclusion, in comparison with the conventional thermal module, the present invention has the following advantages:
1. The present invention improves the problem of the conventional thermal module that the solder paste is apt to be scraped off.
2. The present invention is more securely assembled.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:
1. A thermal module comprising:
a heat dissipation unit having a first main body having a first surface and an opposite second surface and a second main body having a third surface and an opposite fourth surface, two ends of a tubular body being respectively connected with the first and third surfaces, the first and second main bodies and the tubular body together defining a receiving space;
a first radiating fin assembly composed of multiple first radiating fins, each first radiating fin having a same height, disposed in the receiving space, at least one first protrusion section protruding from one side of the first radiating fin assembly, a top end of the first protrusion section being formed with a first apex, two sides of the first apex being formed with a first slope and a second slope; and
a second radiating fin assembly composed of multiple second radiating fins, each second radiating fin having a same height, disposed in the receiving space and correspondingly assembled with the one side of the first radiating fin assembly, at least one second protrusion section protruding from one side of the second radiating fin assembly corresponding to the first protrusion section, a top end of the second protrusion section being formed with a second apex, two sides of the second apex being formed with a third slope and a fourth slope, the second apex correspondingly abutting against the first apex, whereby an open space is defined between the one sides of the first and second radiating fin assemblies.

2. The thermal module as claimed in claim 1, wherein the first and second protrusion sections are respectively arranged on one side of the first radiating fin assembly and one side of the second radiating fin assembly at equal intervals.

3. The thermal module as claimed in claim 1, wherein the first and second protrusion sections are respectively arranged on one side of the first radiating fin assembly and one side of the second radiating fin assembly at unequal intervals.

4. The thermal module as claimed in claim 1, wherein the first radiating fin assembly has a first side and a second side and the second radiating fin assembly has a third side and a fourth side, the first protrusion section protruding from the second side, the second protrusion protruding from the third side corresponding to the first protrusion section.

5. The thermal module of claim 4, wherein the first and second sides each define planar surfaces, parallel to each other, and wherein the third and fourth sides each define planar surfaces, parallel to each other, and wherein the one sides of the first and second radiating fin assemblies are the second and third sides, respectively, and wherein the first and second protrusion sections extend beyond the planar surfaces of the second and third sides, respectively.

6. The thermal module as claimed in claim 1, wherein a depression is further formed on the second apex and the first apex correspondingly abuts against the depression.

7. The thermal module as claimed in claim 1, wherein the first radiating fin assembly further has a first end and a second end and the second radiating fin assembly further has a third end and a fourth end, the first and third ends being flush with each other, the second and fourth ends being flush with each other.

8. The thermal module as claimed in claim 1, wherein the first and second slopes have equal or unequal lengths and the third and fourth slopes have equal or unequal lengths.

9. The thermal module as claimed in claim 1, wherein each first radiating fin has a first plane face, two sides of the first plane face being bent to form a first bent face and a second bent face, each second radiating fin having a second plane face, two sides of the second plane face being bent to form a third bent face and a fourth bent face.

10. The thermal module as claimed in claim 9, wherein the first protrusion section protrudes from the second bent face and the second protrusion section protrudes from the third bent face.

11. The thermal module as claimed in claim 9, wherein the first protrusion section protrudes from the first plane face and the second protrusion section protrudes from the second plane face.

12. The thermal module of claim 1, wherein the receiving space is an annular receiving space and wherein the tubular body is arranged in a center of the annular receiving space.

13. The thermal module of claim 1, wherein the one sides of the first and second radiating fin assemblies each define planar surfaces and wherein the first and second protrusion sections extend beyond the planar surfaces of the one sides of the first and second radiating fin assemblies respectively.

\* \* \* \* \*